United States Patent
Schiessl et al.

(10) Patent No.: US 9,606,178 B2
(45) Date of Patent: Mar. 28, 2017

(54) PARAMETRIC TEST PROGRAM GENERATOR

(71) Applicants: Texas Instruments Incorporated, Dallas, TX (US); Texas Instruments Deutschland GmbH, Freising (DE)

(72) Inventors: Uwe Peter Schiessl, Bayern (DE); Shannon Anthony Wilmes, Allen, TX (US); Istvan Bauer, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 304 days.

(21) Appl. No.: 14/445,843

(22) Filed: Jul. 29, 2014

(65) Prior Publication Data
US 2015/0253380 A1 Sep. 10, 2015

Related U.S. Application Data

(60) Provisional application No. 61/948,719, filed on Mar. 6, 2014.

(51) Int. Cl.
*G06F 17/50* (2006.01)
*G01R 31/3183* (2006.01)

(52) U.S. Cl.
CPC .................. *G01R 31/3183* (2013.01)

(58) Field of Classification Search
CPC .... G11C 29/56; G11C 29/72; G01R 31/2894; G01R 31/31901; G01R 31/3191; G01R 31/257; G01R 35/002; G01R 27/04; G01R 31/001; G01R 31/2822; G01R 31/2891; G01R 31/31713; G01R 31/31907; G01R 27/28

USPC ................... 716/100–104, 136–139
See application file for complete search history.

(56) References Cited

U.S. PATENT DOCUMENTS

| | | | |
|---|---|---|---|
| 6,681,351 B1 | 1/2004 | Kittross et al. | |
| 7,219,314 B1* | 5/2007 | Trimberger | G01R 31/31851 324/526 |
| 7,363,614 B2 | 4/2008 | Kageyama et al. | |
| 8,368,414 B2 | 2/2013 | Ko | |
| 2010/0164519 A1* | 7/2010 | Sellathamby | G01R 1/07385 324/756.03 |
| 2012/0049881 A1* | 3/2012 | Johnson | G01R 31/2894 324/762.01 |

(Continued)

*Primary Examiner* — Binh Tat
(74) *Attorney, Agent, or Firm* — Tuenlap D. Chan; Charles A. Brill; Frank D. Cimino

(57) ABSTRACT

A method of probing wafers includes providing a processor running a parametric test program generator algorithm which execute steps including reading a stored first probe program including a first test sequence (TS1) having a first tests configured for probing at least a first circuit element (FCE) in a first scribe line module. TS1 includes (i) electrical pinning and geometrical data and (ii) first Variable Group data specific for the FCE including first test parameters having at least first forcing conditions. The (ii) is modified with modified second variable group data specific to a second circuit element (SCE) in a second scribe line module. The modified second Variable Group data includes modified second test parameters having second forcing conditions. (i) of TS1 is merged with the modified second Variable Group data to generate code for a second test sequence of a second probe program that is configured for probing the SCE.

20 Claims, 16 Drawing Sheets

(56) References Cited

U.S. PATENT DOCUMENTS

2014/0266282 A1\* 9/2014 Tamura .............. G01R 31/2834
324/756.03

\* cited by examiner

| SMC Module | DUT Nr | SMC Version 1.1 | SMC Version 1.2 |
|---|---|---|---|
| MOD1 | 1 | MC1_L | MC1_L |
| MOD1 | 2 | MC1_S | MC1_N |
| MOD1 | 3 | MC1_N | MC1_S |
| MOD1 | 4 | MC2_W | MC3_R1 |
| MOD1 | 5 | MC2_S | MC3_R2 |
| MOD2 | 1 | MC3_R1 | MC4_1 |
| MOD2 | 2 | MC3_R2 | MC4_2 |
| MOD2 | 3 | MC3_R3 | MC2_W |
| MOD2 | 4 | PAR1 | MC2_S |
| MOD2 | 5 | PAR2 | PAR1 |
| MOD3 | 1 | PAR3 | PAR2 |
| MOD3 | 2 | MC4_1 | PAR3 |
| MOD3 | 3 | MC4_2 | PAR4_A |
| MOD3 | 4 | PAR4_A | MC5_A |
| MOD3 | 5 | PAR4_B | MC5_B |
| MOD3 | 6 | PAR5 | PAR5 |
| MOD4 | 1 | empty | MC3_R3 |
| MOD4 | 2 | empty | PAR6_R1 |
| MOD4 | 3 | empty | PAR6_R2 |
| MOD4 | 4 | empty | PAR4_B |

FIG. 1

|  | MC 1<br>MOS 3.3 V | MC 1<br>MOS 1.8 V |
|---|---|---|
| TEST 1 | VTL @ 3.3 V | VTL @ 1.8 V |
| TEST 2 | VTS @ 3.3 V | VTS @ 1.8 V |
| TEST 3 | IDS | IDS |
| TEST 4 | IDL | IDL |
| TEST 5 | IOF @ 3.6V | IOF @ 1.92V |
| TEST 6 | ISUB | ISUB |
| TEST 7 | SubThresholdSlope | SubThresholdSlope |
| TEST 8 | BVDSS | BVDSS |
| TEST 9 | BVDII | BVDII |

| Test Sequence 1 | Test Sequence 1 |
|---|---|
| Variable Group 3.3V | Variable Group 1.8V |

FIG. 2

| TestSeq | Destruct Level | Component SubGroup | Return | Algo | Algo Parameters |
|---|---|---|---|---|---|
| RES | 1 | R1 | <P>R1 | WWTI_res4 | %p:Hf, %p:Hs, %p:Lf, %p:Ls, p0, p0, p0, 'N', 1, 1, $ftest* %g:W, 0.5, 'N' |
| RES | 1 | R2 | <P>R2 | WWTI_res4 | %p:Hf, %p:Hs, %p:Lf, %p:Ls, p0, p0, p0, 'N', 1, 1, $ftest* %g:W, 0.5, 'N' |
| RES | 1 | R3 | <P>R3 | WWTI_res4 | %p:Hf, %p:Hs, %p:Lf, %p:Ls, p0, p0, p0, 'N', 1, 1, $ftest* %g:W, 0.5, 'N' |
| RES | 2 | CALC(R3) | <S>WR | Calculation | (<P(R2)>R2 * %g:W(R1) - <P(R3)>R3 * %g:W(R3) )/(<P(R3)>R2 - <P(R3)>R3)/2 |
| RES | 2 | CALC(R3) | <S>RS | Calculation | (<P(R2)>R2 * <P(R3)>R3) * (%g:W(R3)-%g:W(R1)) /(<P(R2)>R2 - <P(R3)>R3)/(%g:L(R3)) |
| RES | 2 | CALC(R3) | <S>LR | Calculation | (<P(R1)>R1 * %g:L(R3) - <P(R2)>R2 * %g:L(R1) )/(<P(R1)>R1 - <P(R2)>R2)/2 |
| PL67X | 2 | R1 | RS_IF# | LINE_RS_WR_HD. | %H(R1),%p:L(R1),%H(R2),%p:L(R2),%H(R3),%p:L(R3),%g:L(R3),%W(R1)),($if2*%W(R2)), ($if3* %W(R3)),%g:L(R1)),%g:L(R3),%W(R1),%W(R2),2,R1 |
| PL67X | 2 | R1 | RS# | LINE_RS_WR_HD. | %H(R1),%p:L(R1),%H(R2),%p:L(R2),%H(R3),%p:L(R3),-1,$vf1,$vf2, $vf3, %g:L(R1),%g:L(R3),%W(R1),%W(R2),2,$ilim,R1#,R2#,R3#,WR#,RH# |

| Module | DUT | Version | Element Name | A(um2) A(du2) | L(u) L(du) | Nfi | W(u) W(du) |
|---|---|---|---|---|---|---|---|
| MOD03_MOD04 | 1 | 4.3 | NCH_3P3V_122 | | 0.45 | | 20 |
| MOD03_MOD04 | 2 | 4.3 | NCH_3P3V_122 | | 0.45 | | 0.7 |
| MOD03_MOD04 | 3 | 4.3 | NCH_3P3V_122 | | 20 | | 20 |
| MOD03_MOD04 | 4 | 4.3 | NCH_3P3V_122 | | 4 | | 20 |
| MOD03_MOD04 | 5 | 4.3 | NCH_3P3V_122_W | | 0.45 | | 1000 |
| MOD03_MOD04 | 8 | 4.3 | NCH_1P8V_118 | | 20 | | 20 |
| MOD03_MOD04 | 9 | 4.3 | NCH_1P8V_118 | | 4 | | 20 |
| MOD03_MOD04 | 10 | 4.3 | NCH_1P8V_118_W | | 0.2 | | 1000 |
| MOD03_MOD04 | 1 | 4.3 | PCH_3P3V_124 | | 0.45 | | 20 |
| MOD03_MOD04 | 2 | 4.3 | PCH_3P3V_124 | | 0.45 | | 0.7 |
| MOD03_MOD04 | 3 | 4.3 | PCH_3P3V_124 | | 20 | | 20 |
| MOD03_MOD04 | 4 | 4.3 | PCH_3P3V_124 | | 4 | | 20 |
| MOD03_MOD04 | 5 | 4.3 | PCH_3P3V_124_W | | 0.45 | | 1000 |
| MOD03_MOD04 | 7 | 4.3 | PCH_1P8V_120_PD | | 0.2 | | 0.4 |
| MOD03_MOD04 | 8 | 4.3 | PCH_1P8V_120 | | 20 | | 20 |
| MOD03_MOD04 | 9 | 4.3 | PCH_1P8V_120 | | 4 | | 20 |
| MOD03_MOD04 | 10 | 4.3 | PCH_1P8V_120_W | | 0.2 | | 1000 |

TO FIG. 5B
TO FIG. 5C

FROM FIG. 5A / TO FIG. 5D

| | | | | | | | |
|---|---|---|---|---|---|---|---|
| MOD05_MOD06 | 1 | 4.3 | PPLY_PWL_1 | 9567.3 | 249 | 1 | 38.5 |
| MOD05_MOD06 | 2 | 4.3 | NPLY_NWL_1 | 10000 | 250 | 1 | 40 |
| MOD05_MOD06 | 3 | 4.3 | PPLY_NWL_1 | 10000 | 250 | 1 | 40 |
| MOD05_MOD06 | 4 | 4.3 | NPLY_PWL_1 | 9567.3 | 249 | 1 | 38.5 |
| MOD05_MOD06 | 5 | 4.3 | PPLY_NWL_1PF | 3048 | 0.2 | 381 | 40 |
| MOD05_MOD06 | 1 | 4.3 | NCH_1P8PV_118_PD | | 0.2 | | 20 |
| MOD05_MOD06 | 2 | 4.3 | NCH_1P8PV_118_PD | | 0.2 | | 0.4 |
| MOD05_MOD06 | 3 | 4.3 | PCH_1P8V_120_PD | | 0.2 | | 20 |
| MOD07_MOD08 | 1 | 4.3 | NPLY_NWL_1MF | 4979.7 | 0.4 | 380 | 37.7 |
| MOD07_MOD08 | 2 | 4.3 | NPLY_NWL_1PF | 3048 | 0.2 | 381 | 40 |
| MOD07_MOD08 | 3 | 4.3 | NPLY_PWL_1MF | 6195 | 0.7 | 236 | 37.5 |
| MOD07_MOD08 | 4 | 4.3 | PPLY_NWL_1MF | 6228 | 0.7 | 236 | 37.7 |
| MOD07_MOD08 | 5 | 4.3 | CAP_M2TIN_8V_148 | 1241 | 44 | 1 | 28.2 |
| MOD07_MOD08 | 5 | 4.3 | CAP_SICR2_5V_243 | 1241 | 44 | 1 | 28.2 |
| MOD07_MOD08 | 1 | 4.3 | PPLY_PWL_3 | 9567.6 | 38.5 | 1 | 249 |
| MOD07_MOD08 | 2 | 4.3 | NPLY_NWL_3 | 10000 | 40 | 1 | 250 |
| MOD07_MOD08 | 3 | 4.3 | PPLY_NWL_3 | 10000 | 40 | 1 | 250 |
| MOD07_MOD08 | 4 | 4.3 | NPLY_PWL_3 | 9567.3 | 40 | 1 | 250 |
| MOD07_MOD08 | 5 | 4.3 | PPLY_NWL_3PF | 4950 | 0.45 | 275 | 40 |

MASTER COMP. OR PARASITIC NAME / GEOMETRY INFORMATION

| Element Name | Test Sequence | Variable Groups | Enable |
|---|---|---|---|
| DEN_SVT_HV_ISO_221 | DEMOS | DENMOS221 | 1 |
| DEN_SVT_MV_ISO_201 | DEMOS | DENMOS201,DENMOS221, | 1 |
| DEP_SVT_HV_ISO_231 | DEMOS | DEPMOS231 | 1 |
| DEP_SVT_MV_ISO_211 | DEMOS | DEPMOS211,DEPMOS231, | 1 |
| DIO_ISOPW_NTANK_501 | DIODE | DIODE501,DIODE | 1 |
| DIO_NBL_SUB_505 | DIODE | DIODE505,DIODE | 1 |
| DIO_NISO_SUB_506 | DIODE | DIODE506,DIODE | 1 |
| DIO_NSD_HVPC_502 | DIODE | DIODE502,DIODE | 1 |
| DIO_NSD_MVPC_503 | DIODE | DIODE503,DIODE | 1 |
| DIO_NSD_PW_504 | DIODE | DIODE504,DIODE | 1 |
| DIO_PSD_HVNC_507 | DIODE | DIODE507,DIODE | 1 |
| DIO_PSD_MVNC_508 | DIODE | DIODE508,DIODE | 1 |
| DIO_PSD_NW_509 | DIODE | DIODE504,DIODE | 1 |
| DIO_SCH_HVNC_G_561 | SHTKYDIODE | DIODE561,DIODE | 1 |
| DIO_SCH_MVNC_G_565 | SHTKYDIODE | DIODE565,DIODE | 1 |
| DIO_SCH_MVNC_U_566 | SHTKYDIODE | DIODE566,DIODE | 1 |
| DIO_SCH_MVPC_G_567 | SHTKYDIODE | DIODE567,DIODE | 1 |
| DIO_SCH_MVPC_U_568 | SHTKYDIODE | DIODE568,DIODE | 1 |
| DIO_SCH_NJFET_G_573 | SHTKYDIODE | DIODE573,DIODE | 1 |
| DIO_ZENER_581 | ZDIODE | ZDIODE | 1 |
| JPSND | ParDiode | ParDiode | 1 |
| JNDPD | ParDiode | ParDiode | 1 |
| NCH_HVT_LV_ISO_122 | N122 | N122 | 1 |
| NCH_HVT_LV_SBLK_ISO_124 | N122 | N122 | 1 |
| NCH_SVT_LV_ISO_102 | N122 | N122 | 1 |
| NCH_SVT_LV_SBLK_ISO_104 | N122 | N122 | 1 |
| NCH_SVT_LVD_ISO_106 | N106 | N106,N122 | 1 |
| NCH_SVT_LVD_SBLK_ISO_108 | N106 | N106,N122 | 1 |
| NPN_HV_421 | NPN_N21 | NPN_N21 | 1 |
| NPN_MV_401 | NPN_N21 | NPN_N01,NPN_N21, | 1 |
| PCH_HVT_LV_131 | P111 | P111 | 1 |
| PCH_SVT_LV_111 | P111 | P111 | 1 |
| PCH_SVT_LVD_112 | P112 | P112,P111 | 1 |

| Group | Name | Value | Unit |
|---|---|---|---|
| DEN121 | Vgg | 1.5 | V |
| DEN121 | Vdd | 5.5 | V |
| DEN121 | Vgmin_vt | 0 | V |
| DEN121 | Vgmax_vt | 3 | V |
| DEN121 | Vds_lin | 0.1 | V |
| DEN121 | Vbs_vtlb | 2 | V |
| DEN121 | Jc_vti | 1.00E-07 | A/um |
| DEN121 | Vdd_iof | 5.5 | V |
| DEN121 | Vgsmin_slp | 0 | V |
| DEN121 | Id_bv | 1.00E-06 | A |
| DEN121 | Vdmin_bv | 0 | V |
| DEN121 | Vdmax_bv | 16.5 | V |
| DEN121 | Vstep_gds | 0.1 | V |
| DEN121 | Vstep_gms | 0.05 | V |
| DEN121 | Vds_ibd | 5.5 | V |
| DEN121 | Vgs_ibd | 0.75 | V |
| DEN121 | Vgsmin_isbm | 1.1 | V |
| DEN121 | Vgsmax_isbm | 1.125 | V |
| DEN121 | Polarity | 1 | |
| DEN121 | Type | n | |
| DEN123 | Vgg | 5 | V |
| DEN123 | Vdd | 5.5 | V |
| DEN123 | Vgmin_vt | 0 | V |
| DEN123 | Vgmax_vt | 3 | V |
| DEN123 | Vds_lin | 0.1 | V |
| DEN123 | Vbs_vtlb | 2 | V |
| DEN123 | Jc_vti | 1.00E-07 | A/um |
| DEN123 | Vdd_iof | 5.5 | V |
| DEN123 | Vgsmin_slp | 0 | V |
| DEN123 | Id_bv | 1.00E-06 | A |
| DEN123 | Vdmin_bv | 0 | V |
| DEN123 | Vdmax_bv | 16.5 | V |
| DEN123 | Vstep_gds | 0.1 | V |
| DEN123 | Vstep_gms | 0.05 | V |
| DEN123 | Vds_ibd | 5.5 | V |
| DEN123 | Vgs_ibd | 2.5 | V |
| DEN123 | Vgsmin_isbm | 0.1 | V |
| DEN123 | Vgsmax_isbm | 3.75 | V |
| DEN123 | Polarity | 1 | |
| DEN123 | Type | n | |

*Part which defines the Tests, when choosing a kult function parameters should be automatically populated with the field names stored in the VariableGroups sheet so that those can be overwritten during editing.*

| TestSeq | Destruct Level | Component SubGroup | Return | Algo |
|---|---|---|---|---|
| FUSEK | 2 | COM | #A | xres_lim_pt |
| FUSEK | 2 | L | void | pt_execute |
| MT6XX | 2 | R1 | RS_IF# | xres_lim_pt |
| MT6XX | 2 | R2 | dum1 | xres_lim_pt |
| MT6XX | 2 | R1 | RS# | resv4_lim_i_pt |
| MT6XX | 2 | R2 | dum1 | resv4_lim_i_pt |
| MT6XX | 2 | R1 | void | pt_execute |
| MT6XX | 2 | CALC(R2) | WR# | Calculation |
| PL67X | 2 | R1 | RS_IF# | LINE_RS_WR_HD_pt |
| PL67X | 2 | R1 | RS# | LINE_RS_WR_HD_Vf_pt |
| PL67X | 2 | R1 | void | pt_execute |
| FUSE2 | 2 | COM | dum1 | rsq_pt |
| FUSE2 | 2 | COM | void | ASL2B_Sresv_lim_l_pt |
| FUSE2 | 2 | L | void | pt_execute |
| AC7XX | 1 | COM | C_# | WWTI_xcap_all |
| AC7XX | 2 | COM | LK# | xleak_pt |
| AC7XX | 2 | L | void | pt_execute |
| AC7XX | 2 | COM | void | GOI_BV_sub_norm_pt |
| AC7XX | 2 | L | void | pt_execute |
| AC7XXHBV | 1 | COM | C_# | WWTI_xcap_all |
| AC7XXHBV | 2 | COM | LK# | xleak_pt |
| AC7XXHBV | 2 | COM | void | pt_execute |
| AC7XXHBV | 3 | COM | void | GOI_BV_sub_norm_pt |
| AC7XXHBV | 3 | L | void | pt_execute |
| AC7XXHBV | 4 | COM | BV# | Calculation |
| FC7XX | 1 | COM | C_# | WWTI_xcap_all |
| FC7XX | 2 | COM | LK# | xleak_pt |
| FC7XX | 2 | L | void | pt_execute |
| FC7XX | 3 | BV | void | GOI_BV_sub_norm_pt |
| FC7XX | 3 | DISABLED | void | GOI_BV_sub_norm_pt |
| FC7XX | 3 | BV | void | pt_execute |
| FC7XX | 4 | COM | BV# | Calculation |

| Algo Parameters |
|---|
| %p:Hf, %p:Hs, %p:Lf, %p:Ls, %p:ls,$if, $vlim, ( %g:L / %g:W ), 3, dum1 |
| %p:Hf, %p:Hs, %p:L, %p:L, %p:ls, $if, $vlim, ( %g:L / %g:W ), 1, R1_IF# |
| %p:Hf, %p:Hs, %p:L, %p:L, %p:ls, $if, $vlim, ( %g:L / %g:W ), 1, R2_IF# |
| %p:Hf, %p:Hs, %p:L, %p:L, %p:ls, $vf,$ilim, ( %g:L / %g:W ), R1# |
| %p:Hf, %p:Hs, %p:L, %p:L, %p:ls, $vf,$ilim, ( %g:L / %g:W ), R2# |
| ( R2# * %g:W(R2) - R1# * %g:W(R1))/ ( R2# - R1# ) |
| %H(R1),%p:L(R1),%H(R2),%p:L(R2),%H(R3),%p:L(R3),-1,($if1* %W(R1)),($if2*%W(R2)),%g:L(R1),%g:L(R3),%W(R1) |
| %H(R1),%p:L(R1),%H(R2),%p:L(R2),%H(R3),%p:L(R3),-1,$if1,$vf2, $vf3, %g:L(R1),%g:L(R3), %W(R1),%W(R2),$ilim,R1#,R2#,R3# |
| %p:H,%p:L,p0, p0,$if, $vlim,(%g:L /%g:W), #_IF |
| %p:H,%p:L,p0, $vf,$ilim,(%g:L /%g:W), #, dum1 |
| %H, p0, p0, p0, p0, %p:L, p0, 0.0 ,(%W * %g:L), 1e15, 0, 0, 0.0, "CC#", dum1, dum2, dum3, dum4, dum5, dum6, dum7 |
| %H,-1,%p:L,-1,-1,-1,-1,$vlf,(%g:L * %W),1,2,$ilim |
| %H, p0, p0, p0, %p:L, p0, p0, p0, $vlRamp, $vhRamp, $vstepRamp, 0.0, 0.0,$itarget, $delay, 1, 1, 1, 1, dum1, BV#, dum2 |
| %H, p0, p0, p0, p0, %p:L, p0, 0.0 ,(%W * %g:L), 1e15, 0, 0, 0.0, "CC#", dum1, dum2, dum3, dum4, dum5, dum6, dum7 |
| %H,-1,%p:L,-1,-1,-1,-1,$vlf,(%g:L * %W),1,2,$ilim |
| %pH, p0, p0, p0, p0, %p:L, p0, $vlRamp, $vhRamp, $vstepRamp, $voff, 0.0,$itarget, $delay, 1, 1, 1, 1, dum1, BV#, dum2 |
| (BV# +(-1* $voff)) |
| %H, p0, p0, p0, p0, %p:L, p0, 0.0, 1, 1e15, 0, 0, 0.0, "CC#", dum1, dum2, dum3, dum4, dum5, dum6, dum7 |
| %H,-1,%p:L,-1,-1,-1,-1,$vlf,1,1,2,$ilim |
| %p:H, p0, p0, %p:L,p0, p0, p0, %p:L, p0, p0, p0, $vlRamp, $vhRamp, $vstepRamp1,0,0, 0.0,$itarget1, $delay, 1, 1, 1, 1, dum1, BV#, dum2 |
| %p:H, p0, p0, p0, p0, %p:L, p0, $vlRamp, $vhRamp, $vstepRamp, $voff, 0.0,$itarget, $delay, 1, 1, 1, 1, dum1, BV#, dum2 |
| (BV# +(-1* $voff)) |

FROM FIG. 8A

454

| Module | Module Name Prefix | Module Name Suffix | Generate Tests |
|---|---|---|---|
| BCHD_E002_A | | | yes |
| BCHD_E002_A | | | TRUE |
| BCHD_E002_A | | | 1 |
| BCHD_E002_A | | | no |
| BCHD_E002_A | | | FALSE |
| BCHD_E002_A | | | 0 |
| BCHD_E002_A | | | NO |
| BCHD_E002_A | | | YES |
| BCHD_E003_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | |
| BCHD_E002_A | | | yes |
| BCHD_E002_A | | | yes |
| BCHD_E002_A | | | yes |
| BCHD_E002_A | | | yes |
| BCHD_E002_A | | | yes |
| BCHD_E002_A | | | yes |
| BCHD_E002_A | | | yes |
| BCHD_E002_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | yes |
| BCHD_E003_A | | | yes |

| Test Order | Presto Module | Element Name Prefix | Element Name | Element Name Suffix | Element Sub Group | SVN Prefix | SVN Suffix | DUT # | Pin Block Multiple |
|---|---|---|---|---|---|---|---|---|---|
|  | BCHD_E002_E003 |  | NCH_HVT_LV_ISO_122 |  | N | N122 |  | 1 |  |
| 0 | BCHD_E002_E003 |  | NCH_HVT_LV_ISO_122 |  | S | N122 |  | 2 | 0 |
| 0 | BCHD_E002_E003 |  | NCH_HVT_LV_ISO_122 |  | W | N122 |  | 3 | 0 |
| 0 | BCHD_E002_E003 |  | NCH_HVT_LV_ISO_122 |  | L | N122 |  | 4 | 0 |
| 0 | BCHD_E002_E003 |  | PCH_HVT_LV_131 |  | L | P131 |  | 5 | 0 |
| 0 | BCHD_E002_E003 |  | PCH_HVT_LV_131 |  | W | P131 |  | 6 | 0 |
| 0 | BCHD_E002_E003 |  | PCH_HVT_LV_131 |  | S | P131 |  | 7 | 0 |
| 0 | BCHD_E002_E003 |  | PCH_HVT_LV_131 |  | N | P131 |  | 8 | 0 |
| 1 | BCHD_E002_E003 |  | NCH_HVT_LV_SBLK_ISO_124 |  | N | N124 |  | 1 | 1 |
| 1 | BCHD_E002_E003 |  | NCH_HVT_LV_SBLK_ISO_124 |  | S | N124 |  | 2 | 1 |
| 1 | BCHD_E002_E003 |  | NCH_HVT_LV_SBLK_ISO_124 |  | W | N124 |  | 3 | 1 |
| 1 | BCHD_E002_E003 |  | NCH_HVT_LV_SBLK_ISO_124 |  | L | N124 |  | 4 | 1 |
| 1 | BCHD_E002_E003 |  | NCH_HVT_LV_SBLK_ISO_104 |  | L | N104 |  | 5 | 1 |
| 1 | BCHD_E002_E003 |  | NCH_HVT_LV_SBLK_ISO_104 |  | W | N104 |  | 6 | 1 |
| 1 | BCHD_E002_E003 |  | NCH_HVT_LV_SBLK_ISO_104 |  | S | N104 |  | 7 | 1 |
| 1 | BCHD_E002_E003 |  | NCH_HVT_LV_SBLK_ISO_104 |  | N | N104 |  | 8 | 1 |
| 0 | BCHD_E002_E003_deg |  | NCH_HVT_LV_ISO_122_1 |  | N | N122 |  | 1 | 0 |
| 0 | BCHD_E002_E003_deg |  | NCH_HVT_LV_ISO_122 |  | S | N122 |  | 2 | 0 |
| 0 | BCHD_E002_E003_deg |  | NCH_HVT_LV_ISO_122 |  | W | N122 |  | 3 | 0 |
| 0 | BCHD_E002_E003_deg |  | NCH_HVT_LV_ISO_122 |  | L | N122 |  | 4 | 0 |
| 0 | BCHD_E002_E003_deg |  | PCH_HVT_LV_131 |  | L | P131 |  | 5 | 0 |
| 0 | BCHD_E002_E003_deg |  | PCH_HVT_LV_131 |  | W | P131 |  | 6 | 0 |
| 0 | BCHD_E002_E003_deg |  | PCH_HVT_LV_131 |  | S | P131 |  | 7 | 0 |
| 0 | BCHD_E002_E003_deg |  | PCH_HVT_LV_131 |  | N | P131 |  | 8 | 0 |
| 1 | BCHD_E002_E003_deg |  | NCH_HVT_LV_SBLK_ISO_124 |  | N | N124 |  | 1 | 1 |
| 1 | BCHD_E002_E003_deg |  | NCH_HVT_LV_SBLK_ISO_124 |  | S | N124 |  | 2 | 1 |
| 1 | BCHD_E002_E003_deg |  | NCH_HVT_LV_SBLK_ISO_124 |  | W | N124 |  | 3 | 1 |
| 1 | BCHD_E002_E003_deg |  | NCH_HVT_LV_SBLK_ISO_124 |  | L | N124 |  | 4 | 1 |
| 1 | BCHD_E002_E003_deg |  | NCH_HVT_LV_SBLK_ISO_104 |  | L | N104 |  | 5 | 1 |
| 1 | BCHD_E002_E003_deg |  | NCH_HVT_LV_SBLK_ISO_104 |  | W | N104 |  | 6 | 1 |
| 1 | BCHD_E002_E003_deg |  | NCH_HVT_LV_SBLK_ISO_104 |  | S | N104 |  | 7 | 1 |
| 1 | BCHD_E002_E003_deg |  | NCH_HVT_LV_SBLK_ISO_104 |  | N | N104 |  | 8 | 1 |

FIG. 9B

PARAMETRIC TEST PROGRAM GENERATOR

CROSS REFERENCE TO RELATED APPLICATIONS

This application claims the benefit of Provisional Application Ser. No. 61/948,719 entitled "Parametric Test Program Generator", filed Mar. 6, 2014, which is herein incorporated by reference in its entirety.

FIELD

Disclosed embodiments relate to electrical testing of semiconductor integrated circuit (IC) devices, and more specifically a test program generator for wafer probe testing.

BACKGROUND

Wafer level testing of each integrated circuit (IC) die on a wafer is a step generally performed during semiconductor device fabrication that precedes assembly. A wafer prober is used for wafer level testing. A set of probes on a probe card are held in place while the wafer, vacuum-mounted on a wafer chuck, is moved into electrical contact. The wafer prober can also test scribe line located test circuitry, and some semiconductor companies obtain most of their process performance information from scribe line test structures.

New technologies in the semiconductor industry tend to grow more and more complex. State of the art technologies can support >70 different process flows and >100 technology components (components). Components can be bipolar transistors, Metal Oxide Semiconductor (MOS) transistors or diodes, resistors, capacitors, Electrically Erasable Programmable Read-Only Memories (EEPROMs), Random-access memories (RAMs), etc. The Process Control Document describes test conditions, test devices and test result specifications, which are used for component characterization. A Process Monitoring Chip (PMC), which can be located either on several distinguished locations on the wafer or in the scribe line (Scribe Monitoring Chip SMC) in each reticle shot, provides one or several test devices, which are routinely measured during wafer level testing to characterize those components. Additional Fab control structures are also located in the SMC or PMC and are also measured to monitor critical Fab process loops such as contact loop, via loop, gate-oxide-integrity (GOI), etc. As used herein, reference is made to components including "Master Components" and Fab Control structures (parasitics) both as "elements". Components (e.g., transistors, diodes, capacitors, and resistors) can be differentiated from one another by size, etc.

Scribe line test programs for wafer probe have traditionally comprised approximately 100 tests to cover testing of the various test structures to support the elements of a technology process in the scribe line modules. However, the generation of several thousand tests per parametric test program may now be needed to provide support for all the requirements specified in the applicable Process Control Document. Utilizing an adaptive test may increase/decrease dynamic test coverage on a given test site or wafer(s) based on the test results of a previous test site or wafer(s)) in combination with a component-based test (i.e., testing only those technology elements, which have been utilized for the device design and deactivate all tests associated to the ones which are not used for device design at all, saving test time by testing only qualified elements for a given device) is a modern strategy used in wafer test probe to handle multiple flow and component technologies. Adaptive testing can reduces the sustaining effort for test engineering by maintaining effectively only one global test program per technology.

Recent trends in scribe line layout however have begun implementing strategies that no longer place all the scribe line modules on each device, but limit the test module placement to only those supporting elements, master components (e.g., transistors or diodes) and parasitic elements, which are needed for device layout and functionality testing. This trend, however, while on the one hand saves space in the scribe, increases on the other hand the sustaining effort for the supporting test engineer considerably, who needs to support multiple, sometimes many, probe programs for a given technology.

Simultaneously during process development a growing number of component specific characterization programs (PRIME test programs) are also generally needed to be generated in a timely fashion. Hence test engineers have employed automatic test program generators such as programs distributed by Stone Pillar Technologies, Inc. which provides TestPlanManager (TPM) for automated test plan generation and management. Such software packages help reduce the time to develop Prime test programs considerably, but are still limited when it comes to the development of scribe line probe programs, especially regarding support of mature technologies. Another concern is that the test engineer has only access to his or her test program input information as long as a valid license key for the software is available. Such license keys can be purchased on a yearly base at a cost on the order of several thousand U.S. dollars per license per year.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include parametric test program generator algorithms for wafer probe that utilize an element-based approach, with parameterized test sequences and variable groups associable to circuit elements ("elements") used in column names of tables which refer to physical components including master components (MCs, e.g., transistors or diodes) and parasitics (PAR, e.g., via chains). Each element is associated to a test sequence as well as one or more specific (customized) "Variable Groups". The same test sequence can thus be associated with more than one element.

As used herein, an element is defined as a structure or a group of structures in a layout within a scribe line that allows dispositions decisions for the lot/wafer under test or in a prime monitoring (development) provided for the purpose of monitoring the status of a technology. An example of a single element is a 3.3 V NMOS component. A group of NMOS structures, or "devices under test" (DUTs) or sub-elements, comprises several test transistors using different gate width/length combinations, for example a wide, long, narrow, and a standard structure. Measuring several of those structures allows the extraction of element characteristics, including KPrime, Width and Length Reduction, which are defined in the Process Control Document. As described herein, disclosed test sequences are highly portable to other probe programs or technologies and can support multiple different elements by combining them with different Variable Groups.

Introduction of Sub-component groups, or sub-elements, enhances the flexibility to support multiple DUTs associated to the same element. This can be realized by associating some tests to unique sub-elements and associating those DUTs which shall see those tests with the same sub-element. Associating more than one sub-element group to a single DUT of an element can be used to emulate complex test coverage scenarios. As an example, it is possible to associate a full test sequence comprising tests associated to sub-elements A, B, C, . . . X to a single DUT "a" by flagging this DUT "a" with the sub elements A, B, C, . . . X. Alternately, one can associate the sub-element A to a DUT "b", the sub-element B to a DUT "c" etc. to execute subsets of the full test sequence on the individual DUTs.

Disclosed embodiments include methods of generating probe programs for probing scribe line test modules on substrates referred to herein as wafers. A processor of a computing system runs a parametric test program generator algorithm that is stored in associated memory the causes the processor to execute a series of steps. A first probe program stored (and generally debugged) in the memory is read that includes a first test sequence (TS1) having a first plurality of tests configured for probing at least a first circuit element (FCE) in a first scribe module. The TS1 includes (i) electrical pinning and geometrical data and (ii) first Variable Group data specific for the FCE including first test parameters having at least first forcing conditions (e.g., test a transistor at a 3.3 V power supply).

The FCE can comprise an existing technology MC or PAR component. The (ii)/first variable group data is modified with second Variable Group data specific a second circuit element (SCE), such as a new technology MC that is in another Scribe Monitoring Chip (SMC). A module typically supports several DUTs, which can be associated to different MC and PAR elements. The modified second Variable Group data includes modified second test parameters having second forcing conditions (e.g., test a transistor at 1.8V power supply). The (i) of TS1 and the modified second variable group data are merged to generate code for a second test sequence of a second probe program, where the second test sequence is configured for probing the SCE.

BRIEF DESCRIPTION OF THE DRAWINGS

FIG. 1 shows different permutations of DUTs in 4 scribe line modules associated to MCs/sub-component groups and/or PAR element/sub-component group for an existing SMC program shown as "SMC version 1.1" and a new SMC program shown as "SMC version 1.2", according to an example embodiment.

FIG. 2 shows a new test sequence including a plurality of tests (test 1-test 9) generated from an existing test sequence shown as test sequence 1 for an existing element (MC1) that is a MOS 3.3 V device with a variable group of 3.3 V which can be combined/modified with a new Variable Group 1.8V for generating a new test sequence for probing a new element shown as MC2 that is a MOS 1.8 V device, according to an example embodiment.

FIG. 3 shows an example of disclosed intra/inter DUT extractions using disclosed component/element sub-groups, according to an example embodiment.

FIGS. 5A-D show an example of Module Definition Table, according to an example embodiment.

FIG. 6 shows an example Sequence Association Table, according to an example embodiment.

FIG. 7A shows an example Variable Groups Table presented in one dimension (1D), according to an example embodiment.

FIGS. 8A-B show an example Test Definition Table, according to an example embodiment.

FIGS. 9A-B show an example Module Generation Table, according to an example embodiment.

DETAILED DESCRIPTION

Figure 4:
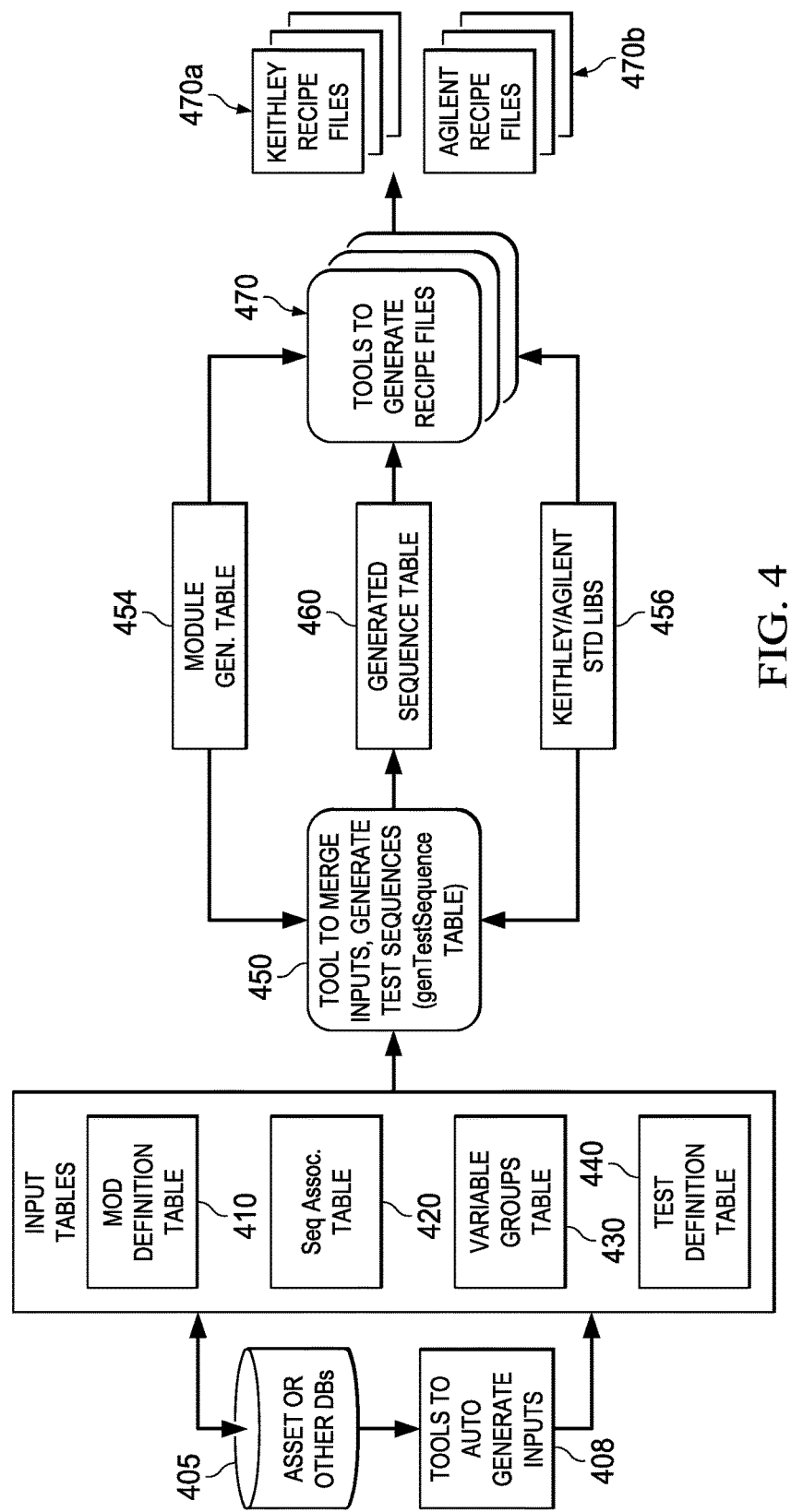
FIG. 4 is flow chart depicting steps for probe program recipe generation using an example parametric test program generator algorithm that processes input data including data from a disclosed Module Definition Table, Sequence Association Table, Variable Groups Table, Test definition Table and Module Generation Table, according to an example embodiment.
Figure 5B:
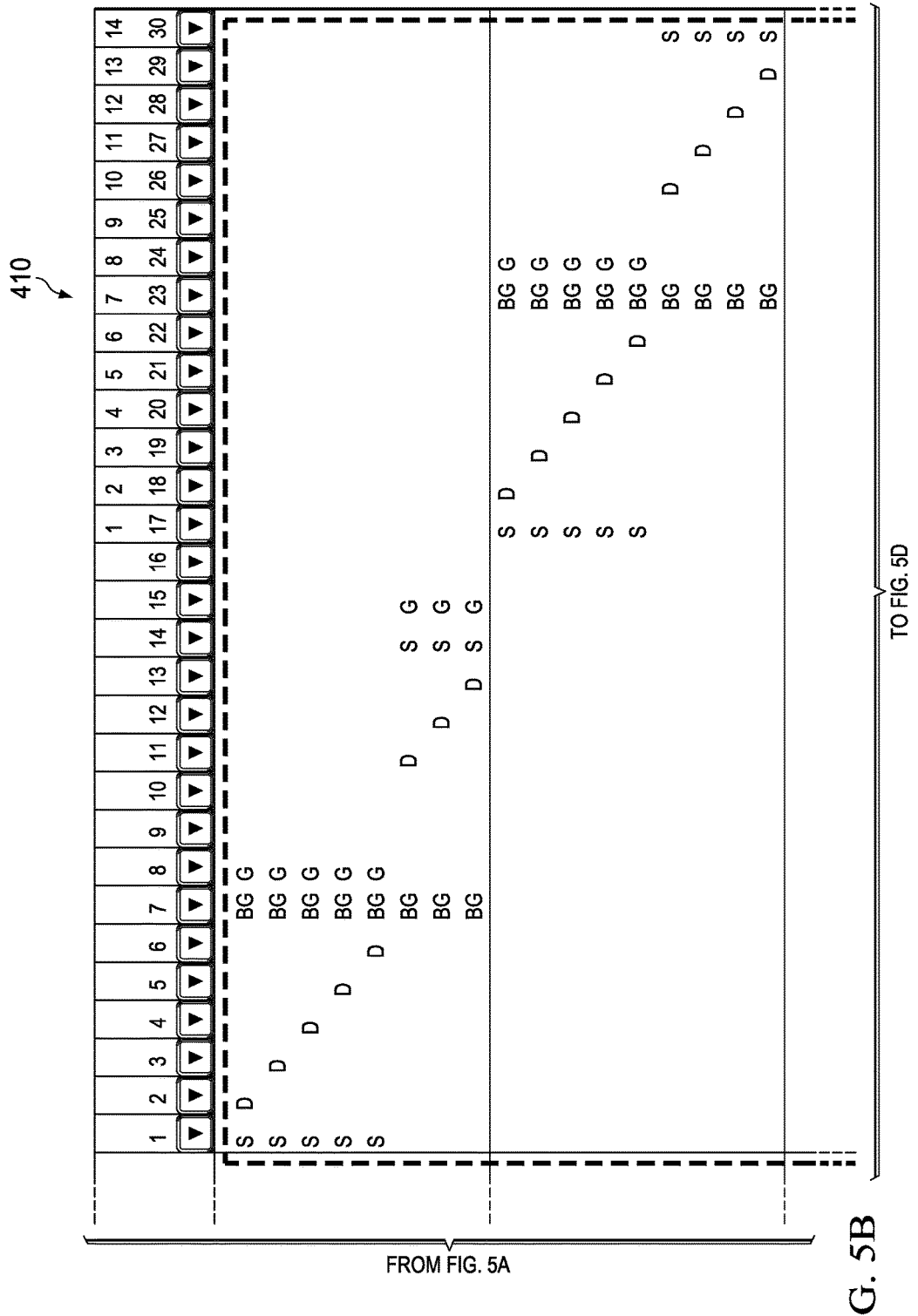
Figure 5D:
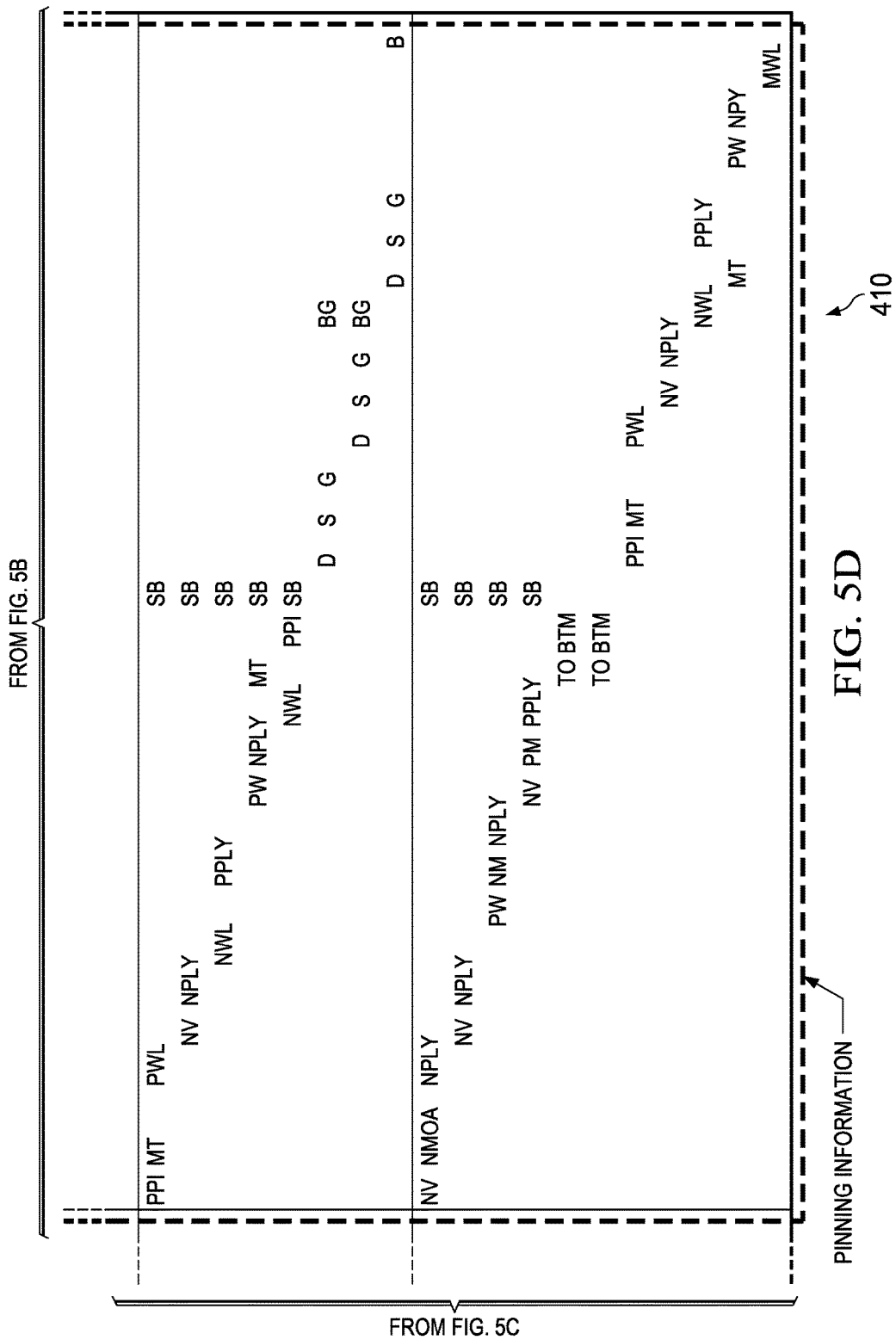

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed parametric test program generator algorithms build parametric probe programs by associating reusable test sequences together with Variable Groups to elements that represent physical components which exist in a SMC module. Generally, there are a plurality of devices under test (DUTs) in each SMC module. DUT's may be considered sub-elements of an element. Elements represent either MC or PAR test structures, such as serving as wafer fab process monitors. For each element a parameterized test sequence and one or more element specific Variable Groups can be associated.

Both the test sequence and variable group are reusable data sets so that the same test sequence can be associated with more than one element. A "test sequence" refers to a series of tests that utilize electrical pinning information and to geometrical information such as width, length, area, etc. which can be related to the respective elements in a module definition table described below as Module Definition Table (see Module Definition Table 410 in FIG. 4 described below). The geometrical information is typically presented in drawn units, however shrink factors are also supported. Variable Groups contain variable test parameter information, such as physical current and voltage forcing conditions used, and test infrastructure information such as ramp conditions and delay times described below provided in a Variable Groups Table 430 (see FIG. 4 described below).

Disclosed parametric test program generator algorithms allow test sequences and Variable Groups to be ported to generate new test sequences that support "comparable" elements in the same other in another technology. For example 5V MOS, 3.3V MOS and 1.8V MOS NMOS and PMOS devices can all be supported by combining the same test sequence with different Variable Groups which associate different bias conditions. A significant concept used in disclosed embodiments is multiple component sub-groups support. The multiple sub-component/sub-element group feature allows complex test coverage and naming scenarios. This feature allows generating probe programs that can be 100% correlated to humanly generated probe programs. Intra-DUT and Inter-DUT extractions are easily and intuitively supported utilizing the (single/multiple) component sub-group approach, which is described below relative to FIG. 3. In the FIG. 3 example, the width, length reduction and the sheet resistance is extracted using the test results from 3 different resistors associated to the component sub-group being sub-elements R1, R2 and R3.

In some cases an element may be supported by more than just one test structure. For example, in FIG. 3 sheet resistance, width and length reduction can be extracted by measuring 3 Resistors with different width and length combinations. To accommodate this, a component sub-group feature is supported, which helps setting up specific tests associated with a specific DUT or a group of specific DUTs. To help generate unique test parameter names, an element name prefix and/or suffix may be used. This allows flexible test naming down to a DUT level. These features enable more effective reuse of element data and test sequences, and significantly ease the translation of even humanly generated test programs from mature technologies to a disclosed format with a 100% test naming and test coverage correlation.

FIG. 1 shows different permutations of DUTs in 4 SMC modules associated to MCs/sub-component group and/or PAR element/sub-component group for an existing SMC program shown as "SMC version 1.1" and a new SMC program shown as "SMC version 1.2", according to an example embodiment. It can be recognized that the same test sequence association established during probe program development for SMC version 1.1 represents a large part of SMC version 1.2, where the elements (MC or PAR) in SMC version 1.2 are the same as SMC version 1.1 except for additional new elements shown as MC5_A and MC5_B and PAR6_R1 and PAR6_R2. Due to this element commonality between SMC version 1 and SMC version 2, the test engineer now only needs to generate test code for the new elements (MC5_A, MC5_B, PAR6_R1 and PAR6_R2). The common elements with their associated test sequences and Variable Groups can simply be copied using disclosed inter-Module DUT extractions that are supported by disclosed algorithms (e.g., from SMC version 1.1 to SMC version 1.2 for elements such as MC3 and PAR4).

Test sequences can also be easily ported from one technology node to another. For example, assume a new technology is designed to support a MOS @ 1.8V Vdd. An already available thoroughly debugged test sequence for a MOS @ 3.3V Vdd from a mature technology can be combined with a new slightly modified Variable Group (associated with MOS @ 3.3 V Vdd) to generate a test sequence to support the new element MOS @ 1.8V as depicted in FIG. 2 which shows a test sequence developed for an element MC2 from test sequence 1 written for an existing technology element (MC1) which can be combined (merged or modified) with a new Variable Group 1.8V to support a new element MC2 1.8 V MOS of the new technology. The slight modifications in this Example involves only changing the bias conditions for the tests. This feature enhances probe test program development efficiency and reduces debug times considerably. This feature also enhances test program development efficiency considerably, reduces human error and significantly reduces debug time due to the ability to use already debugged code for new test sequences.

A significant benefit of this approach is that a once defined and debugged association between an element, test sequence and Variable Group can be reused for each new version of a SMC or a Prime Chip, which is often mainly a permutation of the same element types placed in different locations, plus additional new elements, such as shown in FIG. 1. The test engineer can thus reuse already developed test sequences and can generally concentrate solely on the support for the new elements. Intra- and inter-module DUT extractions are easily supported with disclosed embodiments as well.

During development of a new technology in a semiconductor factory a series of test chips will generally be designed and wafers will then be processed reflecting the design. The test chips include multiple geometrical and conceptual variations of DUTs for a MC under development to find an "optimum" design. All those DUTS for all of the multiple MCs under development need to be tested. A number of component test programs have to be generated for such a task, often under considerable time pressure. Each of such a test program easily results in several thousand tests, which all need to be generated. Disclosed algorithms offer a convenient way to generate the probe programs by exploiting disclosed Inter and Intra technology portability. Test sequences developed for the scribe line probe program can be reutilized for the Prime test development and vice versa, making sure that scribe line and prime test development probe programs can be better correlated and compared.

A test program generally supports a wide variety of different elements that may appear on a given SMC or Prime Chip. Although disclosed parametric test program generator algorithms are generally described combining an existing test sequence with a modified Variable Group to generate a different test program for each element, two or more different elements in a given test program can utilize the same test sequence. For example, during test program generation the test engineer can generate a second test sequence from a first test sequence (TS1) having a first Variable Group by utilizing a second variable group (modified Variable Group B) together with TS1 to support an element X. Later during the test program generation process, the test engineer might notice that he or she can support another different element Y with the same TS1 together with a second modified Variable Group C and implement this arrangement for element Y.

FIG. 3 shows an example of disclosed intra/inter DUT extractions, according to an example embodiment, where two (2) examples for Inter/Intra DUT extractions are shown. Calculations and test function inputs, such as test sequence name, geometrical information and the pinning information can be referenced to individual DUTs associated to a component sub-group (R1, R2 and R3) of an element (R). This feature allows for flexible and efficient support of Inter/Intra DUT extractions. The Test Definition Table 440 described below relative to FIGS. 8A-B define the respective column entries shown in FIG. 3 in more detail.

As noted above, the test sequence in FIG. 3 is referred to as RES supports 3 different sub-elements shown in the component sub-group column as R1, R2 and R3. The total resistance of each sub-element Rx will be tested resulting in output names being the merged string of an element specific Prefix <P> (listed in a disclosed Module Generation Table 454, see Module Generation Table 454 in FIG. 4 described below) and Rx. The extractions, starting with the sub-component sub-group CALC(R3), reference prefix values for each component sub-group (<P(Rx)>) for the same DUT as necessary and are executed once all dependent measurement results are available. There is no need to provide a certain order in which the sub-elements have to be tested. The program generator provides this functionality automatically. When trying to apply the RES test sequence on a different SMC, which does not provide support for all of the required sub-elements, the intra-DUT calculation will generally be dropped automatically.

FIG. 4 is flow chart depicting steps for probe program recipe generation using an example parametric test program generator algorithm, according to an example embodiment. There are input tables shown as "Input Tables", typically generated by a test engineer, including a Module Definition Table 410, Sequence Association Table 420, Variable Groups Table 430 and Test Definition Table 440 which provide inputs for disclosed algorithms to allow probe program generation. Input tables also include a Module Generation Table 454 which controls which scribe-line modules/DUTs are tested (that has example details shown in FIGS. 9A-B).

Inputs for Tables 410, 420, 430 and 440 can be populated directly from a database shown as an "ASSET or other DBs" 405. Inputs for Tables 410, 420, 430 and 440 can also be populated r from ASSET or other DBs 405 through an external tool shown as tools to auto generate inputs 408 to automatically generate these inputs.

Module Definition Table 410 (shown in detail in FIGS. 5A-D) defines which components/elements/DUTS are associated with a given module and also defines the pinning information (values) and geometry information (values) for each DUT. The Module Definition Table 410 is generally "owned" by the Technology Design team.

The Variable Groups Table 430 (See FIG. 7A and FIG. 7B described below) holds all Variable Groups, which can be associated in the Sequence Association Table 420 together with a Test Sequence for each element name listed in the Module Generation Table 454. The Test Definition Table 440 holds a highly parameterized test sequence. A merging tool (shown as genTestSequence table) 450 in FIG. 4 receives data from the Module Generation Table 454 (but does not use the tester PLATFORM specific inputs described below), the four other input Tables, 410, 420, 430, and 440, and tester PLATFORM specific library files and merges all of this information into an intermediate Generated Sequence Table 460 that contains all of the generated test sequences in a tester PLATFORM independent format. The Generated Sequence Table 460, Module Generation Table 454 and other tester PLATFORM specific inputs (scribe data, tail/summary) from Module Generation Table 454, is then shown input to a series of tools to generate all of the recipe files (tools to generate recipe files) 470, shown as Keithley recipe files 470a and Agilent Recipe files 470b.

The Generated Sequence Table 460 can be reviewed and/or edited prior to final generation of the tester recipe files shown as Keithley recipe files 470a and Agilent Recipe files 470b. Tools to generate recipe files 470 can comprise a one-click recipe builder which can take inputs from Tables 410, 420, 430, 440, 454, and Block 456 as inputs to generate the entire recipe 470 in one shot. Alternately, data from Blocks 454, 456, and Generated Sequence Table 460 can be fed into the recipe generation function to create a complete recipe in one shot. This provides flexibility to the test engineer to review and/or edit the generated sequences in Generated Sequence Table 460 prior to recipe generation.

Block 454 represents several inputs, the first of which is the Module Generation Table 454 (see FIGS. 9A-B) as well other tester PLATFORM specific inputs (Keithley Wafer Definition File—WDF, and Agilent WAF and DIE files) which store the device specific spatial location of each SMC relative to the reticle center or reticle lower left corner. These coordinates are the base of the intra site stepping. Block 456 shown as Keithly/Agilent STD Libs stores the tester PLATFORM specific/dependent test libraries which are software layers (C, Basic, or other tester PLATFORM specific language instructions to the hardware connection matrix & instrumentation) referenced in the test sequences as algorithms. Primarily the algorithm "signature" can be used to ensure the algorithms used in the Test Definition Table 440 match the library algorithm definitions, enable type checking of argument values and direction and other miscellaneous error checks.

FIG. 5A-D show an example of Module Definition Table 410, according to an example embodiment. A purpose of the Module Definition Table 410 is to associate geometrical, electrical pinning information, and a named element, with a physical test structure (DUT) on the test module. Module Definition Table 410 can associate to each physical DUT on a test module with an element of the PCD (Process Control Document), generally either a MC or a PAR (e.g., via chain) fab control element. Module Definition Table 410 also provides the necessary geometrical information in drawn units, which automatically can be multiplied with the shrink factor applied to the technology.

Module Definition Table 410 is shown having the following columns:

1. Module Name: A first key to associate a single DUT with geometrical and pinning information from the Test Definition Table 440.
2. DUT Number: A second key to associate a single DUT with geometrical and pinning information from the Test Definition Table 440.

The combination of key 1 and 2 can be repeated several times in the Module Definition Table 410 to support more complex naming and test coverage scenarios. In such a case one can use the Module Name Prefix/Suffix columns shown in the Module Generation Table 454 to generate unique module names if desired.

3. Element Name: this entry is the same as in the Module Generation Table 454.
4. Geometry information: where columns describe basic geometrical features of a device such as gate width, length, Number of Emitter, Number of Devices, Capacitor Area, etc.
5. Pinning information: columns hold the pad number (nr) for the device connections, such as D=Drain, S=Source, G=Gate, H=High, L=Low, etc.

As noted above, for disclosed parametric test program generators, each test performed on a component corresponding to an element (or sub-element) is supported by a combination of a parameterized test sequence (including a plurality of tests) and one or more Variable Groups. FIG. 6 shows an example Sequence Association Table 420, according to an example embodiment. Each element name shown is shown associated with the combination of a Test Sequence and one or more Variable Groups. Component-based test generation is thus possible, by retaining only qualified components, for a given device or flow, from the global technology level Sequence Association Table 420, multiple Variable Groups can be associated to a particular element. The Sequence Association Table 420 generally includes the following columns shown:

1. Element Name: This is a merged string from the columns element name prefix, element name and element name suffix provided by the Module Generation Table 454 (see FIG. 9B).
2. Test Sequence: holds the name of the test sequence item 1 of test sequence section below as defined in the Test Definition Table 440.
3. Variable Groups: holds one or more comma delimited Variable Group names. The content of the left most can overwrite same variable name used in Variable Group placed in a more right position.
4. Enable: The test engineer can activate or deactivate an association in this column. This allows her to generate element/component dependent test programs. Tailored programs for supporting only those MCs of a technology, which are actually are needed for final product functionality.

By adjusting the enable column a test engineer can easily generate component specific test programs, by simply enabling/disabling the association for a given element. In one specific example, a via-chain is disabled, since no metal 4 was supported in the technology flow used. Component-based testing can serve as an important strategy to save test time, by testing only those components of a technology which are actually used during design and layout of a given device.

As noted above, test sequences can be used for more than one element together with different Variable Groups. The Variable Groups can ensure that the proper Vdd, polarity, etc. is used for testing a specific element. When multiple Variable Groups are associated with an element, the content of the groups on the left can overwrite the content of the groups listed on the right. One can for example consider gathering all variables necessary to control the test infrastructure such as ramp conditions, delays, integration time, options, etc. in a MOS Variable Group and then place the voltage node and type related information in a second Variable Group NMOS5V. The enable column enables (or disables) a component test feature for disclosed test program generators.

FIG. 7A shows an example Variable Groups Table 430, according to an example embodiment. Variable Groups Table 430 provides a location having information that a test sequence can refer to. Variable Groups Table 430 is shown including 4 columns:
1. Group: Name of the Variable Group. This name can be used in the Sequence Association Table 420 to associate a Variable Group to an Element and a Test Sequence.
2. Variable Name: The Test Definition Table 440 refers to a variable from the Variable Group, such as $delay, by using the $Variable_Name key word.
3. Value: The value with which the $Variable_Name can be replaced during Sequence Generation.
4. Unit: for documentation, the unit of the value.

Figure 7B:
FIG. 7B shows an example Variable Groups Table presented in two dimensions (2D), according to an example embodiment.

FIG. 7B shows an example 2D Variable Groups Table 430', according to an example embodiment. Variable Groups Table 430' represents the same data as in Variable Groups Table 430 shown in FIG. 7A, but in a different, 2 dimensional (2D) table format.

FIGS. 8A-B show an example Test Definition Table 440, according to an example embodiment, shown including 6 columns. The Test Definition Table 440 has the same column contents as FIG. 3 described below to explain disclosed intra/inter DUT extractions using disclosed component/element sub-groups. Test Definition Table 440 includes the following columns:

1. TestSequence: holds the name of the test sequence. This name can be used in the Sequence Association Table 420 to associate a test sequence to a disclosed element.
2. Destruct Level: The destruct level allows the test engineer to influence the position of the test within a test macro. The higher the destruct level, the later the test will be executed in the macro.
3. Component Sub-Group: Can be COM, CALC or any other Name. COM and CALC are reserved names. COM can force the marked test to be executed for each DUT associated with a non-empty-element Sub-Group entry in the Module Generation Table 454. CALC supports Intra/Inter-Module extractions making sure the calculation will be executed after the last necessary input value is defined, ensuring that all required inputs are available for the extraction. Any other name used in the column can force the test sequence line to be executed, if applied to a DUT, which uses the same name somewhere in the list of one or more Element Sub-group names associated to the DUT in the Element Sub-group entry in the Module Generation Table 454.
4. Return: Can be a "void" or another return value, such as from a Keithley ktxe kult function call. In case of an Agilent test function, this column will generally be empty. In case a non-void return value is supported by the test function <p>, <P>, #, <p(LESG)>, <P(LESG)> type variables are referring to the SVN prefix column in the Module Generation Table 454 (see FIG. 9B described below) or <s>, <S>, <s(LESG)>, <S(LESG)> type referring to the SVN suffix column in the Module Generation Table 454 (see FIG. 9B described below), where LESG represents the left-most Element Sub-group defined. The SVN prefix and SVN suffix columns shown in FIG. 9B are used for output test result (parameter) naming.
5. Algo: This is the name of a test function of a Keithley Sxxx tester or an Agilent 40xx tester.
6. Algo Parameters: Contains parameterized comma delimited input and output values for a Keithley Sxxx or an Agilent 40xx tester. Several types of variable are supported in these columns. The parameterized values can currently reference SVN Prefix and/or SVN Suffix values, from the Module Generation Table 454, using #, <p>, <P>, <s>, <S>, <p(LESG)>, <P(LESG)>, <s(LESG)>, <S(LESG)> syntax, can reference geometrical and pinning values, from the Module Definition Table 410, using % g:GEOMETRY or % g:GEOMETRY(LESG), and % p:PIN or % p:PIN(LESG), syntax, respectively, and/or they can reference variable group values, from the Variable Groups table, using $VARIABLE syntax.

An additional comment column (not shown) may be added to the Test Definition Table 440. This column can be used to generate custom test documentation. The same kind of variables as in the column Algo parameter can be used to fill the comments with test specific information.

An example Module Generation Table 454 shown in FIGS. 9A-B. Module Generation Table 454 controls which modules and DUTs have tests generated (consistent with the actual scribe module data) and acts as a filter for the associated data in the Module Definition Table 410. Only modules and DUTs referenced in the Module Generation Table 454 that are also found in the Module Definition Table 410 will have tests generated, assuming the associated elements have an associated test sequence assigned in the Sequence Association Table 420. Module Generation Table 454 is generally "owned" by the test engineer and associates each DUT to a certain element (MC or PAR) and an element sub-group within an element.

Module Generation Table 454 has a module column (FIG. 9A), DUT # column (FIG. 9B), Presto module (FIG. 9B) and an element name column (FIG. 9B). The module column together with the DUT # column are used to reference to the geometrical and pinning information defined in the Module Definition Table 454. The Presto module column can deviate from the module column to support for example scenarios where 2 modules, which are located within a fixed distance on a layout block can be contacted with a single probe card using 2× number of needles (block testing). For example a 32 pin probe card can be used to contact two 16 pad modules with one touchdown. Hence only one Test Macro is necessary to support all tests to be performed on both SMC modules. Module Name Prefix (FIG. 9A), Presto Module Name (FIG. 9B) and Module Name Suffix (FIG. 9A) can be used for naming the test macros and Presto Module Name is used as the Subsite/Module Name within the test program. As noted above, the SVN prefix and SVN suffix columns shown in FIG. 9B are used for output test result (parameter) naming.

Typically, an element defined in the Module Generation Table 454 will match the element defined in the Module Definition Table 410, but this is not required and element naming can be controlled with the optional element name prefix and/or suffix shown in FIG. 9B. This is sometimes useful, especially if one or more test structures can be leveraged to support multiple technologies and/or PAR elements. For example the same MOS structure can be used to characterize not only a 5V MOS element using 5V test conditions but also a 3.3 V MOS element using 3.3V test conditions. The Module Generation Table 454 also drives/controls the test order with a test order entry and also can drive test naming by supporting both Prefix and Suffixes, which can be leveraged to generate even more complex parameter naming. Additionally, the Pin Block Multiple column shown controls block pin naming and can define an integer pin map multiple to be defined for block testing.

The element names include element name prefixes which allows generation of unique element name by combining the element name from the Module Definition Table 410 with a prefix to support more than one test sequence to be associated to a single element or a sub-element in the Sequence Association Table 420. The Sequence Association Table 420 can refer to the combination of the element name prefix, element name, and element name suffix from the Module Generation Table 454. This combination may deviate from the element name used in the Module Definition Table 410 and the Element Name from the Module Generation Table 454 itself may not match the element name from the Module Definition Table 410. This allows the generation of unique output names for DUTs sharing the same element type and implicitly same test sequences.

The element name suffixes allow generation of a unique element name by combining the Element Name from the Module Definition Table 410 with a suffix to support more than one test sequence to be associated to a single element or a sub-element in the Sequence Association Table 420. The Sequence Association Table 420 can refer to the combination of the element name prefix, element name, and element name suffix from the Module Generation Table 454. This combination may deviate from the element name used in the Module Definition Table 410 and the element name from the Module Generation Table 454 itself may not match the element name from the Module Definition Table 410. This allows the generation of unique output names for DUTs sharing the same element type and implicitly same test sequences.

Module Generation Table 454 also includes an Element sub-group column. This column can hold multiple entries, segregated with a comma or another suitable character. The leftmost entry in this column (LESG) can be used to distinguish between several DUTs, associated to the same element in case of tests on several DUTs are needed to extract element test attributes, which can be documented in the Process Control document. To support intra module/inter module calculations using test results from DUTs located in the same or different modules, these left most entries in this column can be used. The test engineer can setup such calculations, by referencing Width/Length, Pinning, Prefix and/or Suffix using a % g:W(LESG) (geometrical Info), % p:H(LESG)(Pinning Info), <P(LESG)>(Prefix), <S(LESG)> (Suffix Info) etc. . . . syntax. Other entries can be associated to single tests or a sub-group of tests in the test sequence to distinguish between Tier 1, 2, 3, . . . test coverage scenarios. It is noted that each DUT generally sees the full test sequence. In practice often parts of the test sequence will be tested on different DUTs associated to the same element.

A significant benefit of using the disclosed element-based approach that uses an association of element name, test sequence, and at least one Variable Group, is that a test sequence which has already been developed and debugged, can be stored in a database and afterwards reutilized in combination with other Variable Groups to support other technology nodes or other device types. For example, a test sequence developed for a 5V NMOS element can be ported to support 5V PMOS or even 1.8V or 3.3V NMOS or PMOS elements, by combining it with an appropriate modified Variable Group. Disclosed algorithms can also automatically account for all the permutations of assembling DUTs in different modules during development of new test chip revisions. The test engineer can therefore concentrate his work on the support of new elements. This can save significant work otherwise required of the test engineer with the potential of always bringing in new errors to debug.

Figure 10:
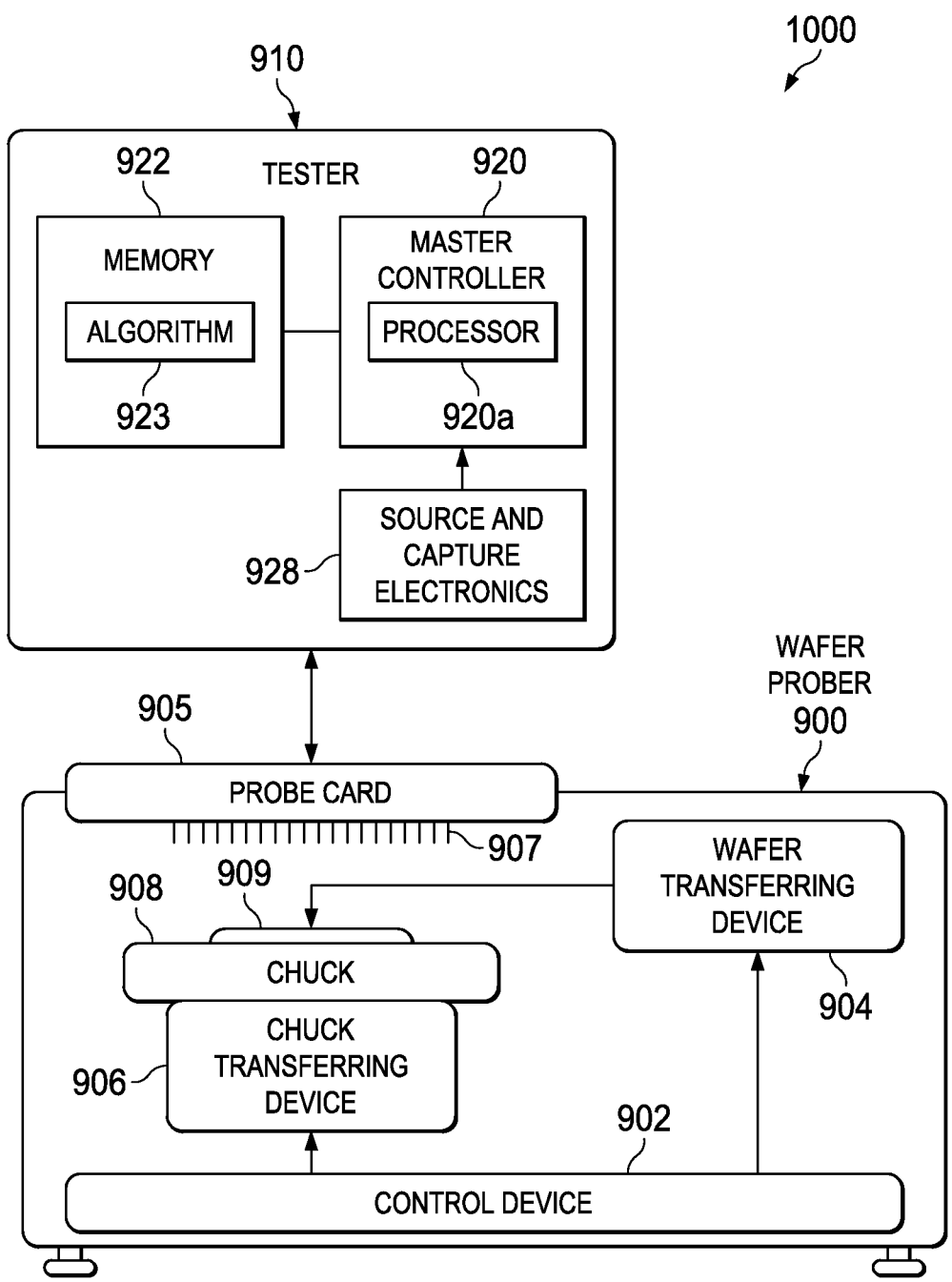
FIG. 10 is a block diagram depiction of a wafer probe system including a tester implementing a disclosed parametric test program generator, according to an example embodiment.

FIG. 10 is a block diagram depiction of a wafer probe system 1000 including a tester 910 implementing a disclosed parametric test program generator algorithm together with a wafer prober 900. As known in the art, a wafer prober 900 is a device for connecting a plurality of chips (die) on a wafer to a tester. The tester 910 is shown including a master controller 920 including a processor 920*a* running a disclosed parametric test program generator algorithm 923 that is stored in associated memory 922. Source and capture electronics 928 is coupled to master controller 920. Such a tester 910 connected to the chips or SMC on the wafer 909 through the wafer prober 900 and is configured to provide electrical signals to the chips or SMC and inspect the results of provision, thus examining whether abnormalities or defects are present in each of the chips or SMC.

Regarding operation of the wafer prober 900, when a wafer 909 on which a plurality of die/chips or SMCs is formed is loaded into a chuck 908 through a wafer transferring device 904, the chuck 908 is transferred in X, Y and Z directions so that a plurality of probes 907 provided in a probe card 905 is aligned and put into contact with the bond pads on the plurality of chips or SMCs provided on the wafer 909 through a chuck transferring device 906. Control device controls the wafer transferring device 904 and the chuck transferring device 906. Here, the X and Y directions denote a direction horizontal to the surface of the chuck plate, and the Z direction denotes a direction perpendicular to the surface of the chuck plate. When the plurality of probes come into contact with the plurality of pads, respectively, the source electronics of the source and capture electronics 928 of tester 910 provides test signals corresponding to a predetermined program to the chips or SMCs through tester connection terminals and the probes 907, and the chips or SMCs provide output signals corresponding to the test signals to the capture electronics of source and capture electronics 928 of the tester 910, thus testing each chip or SMC on the wafer 909 for its electrical characteristics.

Disclosed embodiments can be used on a variety of testers a variety of different IC devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of probing wafers, comprising:
providing a processor running a parametric test program generator algorithm stored in associated memory causing said processor to:
read a stored first probe program including a first test sequence (TS1) having a first plurality of tests configured for probing a first circuit element (FCE) in a first scribe line module, said TS1 including electrical pinning and geometrical data and first Variable Group data specific for said FCE, the first Variable Group data including first test parameters having first forcing conditions;
modify said first Variable Group data to generate modified second Variable Group data specific to a second circuit element (SCE) in a second scribe line module, said modified second Variable Group data include modified second test parameters having second forcing conditions, and
merge said electrical pinning and geometrical data of said TS1 with said modified second Variable Group data to generate a second test sequence of a second probe program, said second test sequence configured for probing said SCE; and
Executing by said processor said second test sequence for probing said SCE.

2. The method of claim 1, further comprising:
copying a first additional test sequence (TS1A) having a first plurality of additional tests configured for probing a common circuit element in said first probe program into said second probe program;
wherein said first scribe line module and said second scribe line module both include the common circuit element different from said FCE.

3. The method of claim 1, wherein said FCE and said SCE both comprise a master component selected from a group consisting of a transistor, a diode, a capacitor, a resistor, and a parasitic test structure.

4. The method of claim 1, further comprising:
utilizing a Module Generation Table that associates said electrical pinning and geometrical data with element names and element sub-groups for providing test sequence and naming control, with a first physical test structure on said first scribe line module, wherein said element sub-groups are configured for selecting tests associated with said first physical test structure.

5. The method of claim 4, wherein said FCE is associated with said first Variable Group data and a third Variable Group data.

6. The method of claim 1, wherein said first test parameters further comprise test infrastructure information including at least one of ramp conditions and delay times.

7. The method of claim 1, wherein said parametric test program generator algorithm utilizes an element naming convention including at least one of a prefix and a suffix which provides a plurality of unique element names from a given element name by combining a name of said FCE and said SCE with a respective one of said prefix or suffix additional to support a test sequence in addition to said TS1 to be associated with said FCE and a test sequence in addition to said second test sequence to be associated with said SCE.

8. A wafer probe system, comprising:
a chuck for holding a wafer to be probed;
a tester including a master controller including a processor coupled to a probe card having probes matched to bond pads in scribe line regions of said wafer, said processor, upon implementing a parametric test program generator algorithm stored in associated memory, is configured to perform:
reading a stored first probe program including a first test sequence (TS1) having a first plurality of tests configured for probing a first circuit element (FCE) in a first scribe line module, said TS1 including electrical pinning and geometrical data and first Variable Group data specific for said FCE, the first Variable Group data including first test parameters having first forcing conditions;
modifying said first Variable Group data to generate modified second Variable Group data specific to a second circuit element (SCE) in a second scribe line module, said modified second Variable Group data include modified second test parameters having second forcing conditions,
merging said electrical pinning and geometrical data of said TS1 with said modified second Variable Group data to generate a second test sequence of a second probe program, said second test sequence configured for probing said SCE; and
Executing by said processor said second test sequence for probing said SCE.

9. The wafer probe system of claim 8, wherein:
said first scribe line module and said second scribe line module both include a common circuit element different from said FCE;
said processor is configured to perform: copying a first additional test sequence (TS1A) having a first plurality of additional tests configured for probing said common circuit element in said first probe program into said second probe program.

10. The wafer probe system of claim 8, wherein said FCE and said SCE both comprise a master component selected from a group consisting of a transistor, a diode, a capacitor, a resistor, and a parasitic test structure.

11. The wafer probe system of claim 8, wherein said processor is configured to perform:
utilizing a Module Generation Table that associates said electrical pinning and geometrical data with element names and element sub-groups for providing test sequence and naming control, with a first physical test structure on said first scribe line module, wherein said element sub-groups are configured for selecting tests associated with said first physical test structure.

12. The wafer probe system of claim 11, wherein said FCE is associated with said first Variable Group data and a third Variable Group data.

13. The wafer probe system of claim 8, wherein said first test parameters further comprise test infrastructure information including at least one of ramp conditions and delay times.

14. The wafer probe system of claim 8, wherein said first test parameters further comprise test infrastructure information including at least one of ramp conditions and delay times.

15. The wafer probe system of claim 8, wherein said parametric test program generator algorithm utilizes an element naming convention including at least one of a prefix and a suffix which provides a plurality of unique element names from a given element name by combining a name of said FCE and said SCE with a respective one of said prefix or suffix additional to support a test sequence in addition to said TS1 to be associated with said FCE and a test sequence in addition to said second test sequence to be associated with said SCE.

16. A non-transitory data storage medium that includes instructions for a parametric test program generator algorithm, which upon being implemented by a processor, causes said processor to perform:
   reading a stored first probe program including a first test sequence (TS1) having a first plurality of tests configured for probing a first circuit element (FCE) in a first scribe line module, said TS1 including electrical pinning and geometrical data and first Variable Group data specific for said FCE, the first Variable Group data including first test parameters having first forcing conditions;
   modifying said first Variable Group data to generate modified second Variable Group data specific to a second circuit element (SCE) in a second scribe line module, said modified second Variable Group data include modified second test parameters having second forcing conditions,
   merging said electrical pinning and geometrical data of said TS1 with said modified second Variable Group data to generate a second test sequence of a second probe program, said second test sequence configured for probing said SCE; and
   Executing by said processor said second test sequence for probing said SCE.

17. The non-transitory data storage medium of claim 16, wherein:
   said first scribe line module and said second scribe line module both include a common circuit element different from said FCE:
   said parametric test program generator algorithm, which upon being implemented by said processor, causes said processor to perform: copying a first additional test sequence (TS1A) having a first plurality of additional tests configured for probing said common circuit element in said first probe program into said second probe program.

18. The non-transitory data storage medium of claim 16, said parametric test program generator algorithm, which upon being implemented-by said processor, causes said processor to perform:
   utilizing a Module Generation Table that associates said electrical pinning and geometrical data with element names and element sub-groups for providing test sequence and naming control, with a first physical test structure on said first scribe line module, wherein said element sub-groups are configured for selecting tests associated with said first physical test structure.

19. The non-transitory data storage medium of claim 16, wherein said first test parameters further comprise test infrastructure information including at least one of ramp conditions and delay times.

20. The non-transitory data storage medium of claim 16, wherein said parametric test program generator algorithm, which upon being implemented-by said processor, causes said processor to perform:
   utilizing an element naming convention including at least one of a prefix and a suffix which provides a plurality of unique element names from a given element name by combining a name of said FCE and said SCE with a respective one of said prefix or suffix additional to support a test sequence in addition to said TS1 to be associated with said FCE and a test sequence in addition to said second test sequence to be associated with said SCE.

* * * * *